US008174259B2

(12) United States Patent
Hattersley et al.

(10) Patent No.: US 8,174,259 B2
(45) Date of Patent: May 8, 2012

(54) APPARATUS AND METHOD FOR DETERMINING MAGNETIC PROPERTIES OF MATERIALS

(75) Inventors: Simon Richard Hattersley, Bickley Kent (GB); Quentin Andrew Pankhurst, Hertfordshire (GB); Audrius Brazdeikis, Missouri City, TX (US)

(73) Assignees: University of Houston, Houston, TX (US); University College London, London (GB)

( * ) Notice: Subject to any disclaimer, the term of this patent is extended or adjusted under 35 U.S.C. 154(b) by 560 days.

(21) Appl. No.: 11/912,930

(22) PCT Filed: Apr. 28, 2006

(86) PCT No.: PCT/GB2006/001575
  § 371 (c)(1),
  (2), (4) Date: Aug. 18, 2008

(87) PCT Pub. No.: WO2006/117530
  PCT Pub. Date: Nov. 9, 2006

(65) Prior Publication Data
  US 2009/0201016 A1    Aug. 13, 2009

(30) Foreign Application Priority Data
  Apr. 29, 2005 (GB) .................................. 0508886.9

(51) Int. Cl.
  *G01R 33/02* (2006.01)
  *G01R 33/12* (2006.01)
(52) U.S. Cl. ........................ 324/248; 324/239
(58) Field of Classification Search .................. 324/248, 324/239
  See application file for complete search history.

(56) References Cited

U.S. PATENT DOCUMENTS
  3,449,662 A    6/1969 Wood
  (Continued)

FOREIGN PATENT DOCUMENTS
  EP    0595227    1/1998
  (Continued)

OTHER PUBLICATIONS

Cash, et al., "Breast Cancers: Noninvasive Method of Preoperative Localization with Three-dimensional US and Surface Contour Mapping," Published online before print Sep. 21, 2007, doi: 10.1148/radiol.2452060906; Nov. 2007 Radiology, 245, pp. 556-566 (downloaded on Sep. 28, 2011 from http://radiology.rsna.org/ content/245/2/556.full).

(Continued)

Primary Examiner — M'Baye Diao
(74) Attorney, Agent, or Firm — K&L Gates LLP

(57) ABSTRACT

Apparatus for determining magnetic properties of materials comprises a portable probe (1), an equipment trolley (2) holding cryogenics and electronics and connecting cables (3). The probe (1) comprises a drive coil (4) and a correction coil (5), the drive coil (4) being disposed symmetrically with respect to an inner second-order gradiometer sensor coil (8). Electrical connectors in the form of 2-meter long Belden (1192A) microphone cables (3) are used to connect the apparatus on the equipment trolley (2) to the drive coil (4), the correction coil (5) and the sensor coil (8). The drive coil (4) is driven so as to generate a sinusoidally varying magnetic field. The electronics comprise a flux-locked loop (9), a SQUID controller (10), a data acquisition module (11), which captures and processes the signals and a computer (12). A liquid-nitrogen dewar (13) is supported on the equipment trolley (2) and houses a sensitive SQUID detector (14) and a transfer coil (15) made from copper. Possible applications of the apparatus include an intra-operative tool for sentinel lymph node detection in the treatment of breast cancer, and a non-destructive evaluation tool for detecting voids and defects in aluminum and applications in the aeronautics industry.

10 Claims, 9 Drawing Sheets

U.S. PATENT DOCUMENTS

| | | | |
|---|---|---|---|
| 4,324,255 A | | 4/1982 | Barach et al. |
| 4,983,912 A | | 1/1991 | Roehrlein et al. |
| 5,184,070 A | * | 2/1993 | Besendorfer et al. ......... 324/225 |
| 5,261,403 A | | 11/1993 | Saito et al. |
| 5,293,119 A | | 3/1994 | Podney |
| 5,363,845 A | | 11/1994 | Chowdhury et al. |
| 5,402,094 A | | 3/1995 | Enge |
| 5,414,356 A | | 5/1995 | Yoshimura et al. |
| 5,416,413 A | | 5/1995 | Leussler |
| 5,437,280 A | | 8/1995 | Hussman |
| 5,534,778 A | | 7/1996 | Loos et al. |
| 5,537,037 A | | 7/1996 | Otaka et al. |
| 5,666,052 A | | 9/1997 | Sata |
| 5,997,473 A | * | 12/1999 | Taniguchi et al. ............ 600/117 |
| 6,205,352 B1 | | 3/2001 | Carroll |
| 6,445,185 B1 | | 9/2002 | Damadian et al. |
| 6,549,800 B1 | | 4/2003 | Atalar et al. |
| 6,603,308 B2 | * | 8/2003 | Itozaki et al. ................. 324/248 |
| 6,815,949 B2 | * | 11/2004 | Kandori et al. ............... 324/248 |
| 6,835,572 B1 | | 12/2004 | Mountford et al. |
| 6,850,065 B1 | | 2/2005 | Fujita et al. |
| 6,889,073 B2 | | 5/2005 | Lampman et al. |
| 6,920,346 B2 | | 7/2005 | Kazandjian et al. |
| 6,949,926 B2 | | 9/2005 | Murakami et al. |
| 6,963,769 B1 | | 11/2005 | Balaban et al. |
| 7,009,398 B2 | | 3/2006 | Hahn et al. |
| 7,084,631 B2 | | 8/2006 | Qu et al. |
| 7,116,094 B2 | * | 10/2006 | Levin et al. ............... 324/117 H |
| 7,283,868 B2 | | 10/2007 | Ko et al. |
| 7,335,511 B2 | | 2/2008 | Mountford et al. |
| 7,386,338 B2 | | 6/2008 | Hoppel et al. |
| 7,416,533 B2 | | 8/2008 | Gellman et al. |
| 7,479,784 B2 | | 1/2009 | Lee |
| 7,525,308 B2 | | 4/2009 | Tsukada et al. |
| 7,570,056 B2 | | 8/2009 | Nakabayashi et al. |
| 7,676,256 B2 | | 3/2010 | Satragno et al. |
| 7,680,524 B2 | | 3/2010 | Ogawa et al. |
| 7,689,267 B2 | | 3/2010 | Prince |
| 7,701,209 B1 | | 4/2010 | Green |
| 7,711,407 B2 | | 5/2010 | Hughes et al. |
| 2002/0161298 A1 | | 10/2002 | Burbank et al. |
| 2003/0016010 A1 | | 1/2003 | Kandori et al. |
| 2003/0078493 A1 | | 4/2003 | Ogawa et al. |
| 2003/0141868 A1 | * | 7/2003 | Bakharev ..................... 324/248 |
| 2004/0162477 A1 | | 8/2004 | Okamura et al. |
| 2004/0249261 A1 | | 12/2004 | Torchia et al. |
| 2005/0059881 A1 | | 3/2005 | Balaban et al. |
| 2005/0148863 A1 | | 7/2005 | Okamura et al. |
| 2006/0074295 A1 | | 4/2006 | Kucharczyk et al. |
| 2006/0173283 A1 | | 8/2006 | Axelsson et al. |
| 2006/0258933 A1 | | 11/2006 | Ellis et al. |
| 2006/0270930 A1 | | 11/2006 | Brasile |
| 2008/0146914 A1 | | 6/2008 | Polzin et al. |
| 2008/0214930 A1 | | 9/2008 | Brasile |
| 2008/0275333 A1 | | 11/2008 | Fain et al. |
| 2008/0294036 A1 | | 11/2008 | Hoi et al. |
| 2009/0024022 A1 | | 1/2009 | Azar et al. |
| 2009/0082662 A1 | | 3/2009 | Israel |
| 2009/0118611 A1 | | 5/2009 | He |
| 2009/0201016 A1 | | 8/2009 | Hattersley et al. |
| 2010/0099978 A1 | | 4/2010 | Geppert et al. |
| 2010/0125191 A1 | | 5/2010 | Sahin |

FOREIGN PATENT DOCUMENTS

| | | |
|---|---|---|
| FR | 2689638 | 8/1993 |
| GB | 2109112 | 5/1983 |
| JP | 02-281170 | 11/1990 |
| JP | 05-251774 | 9/1993 |
| JP | 10-038854 | 2/1998 |
| JP | 2003-149212 | 5/2003 |
| JP | 2006-030004 | 2/2006 |
| WO | 2006022786 | 3/2006 |
| WO | 2006117530 | 11/2006 |

OTHER PUBLICATIONS

Conners, "Diagnostic uses of metal detectors: a review," Int. J. Clin. Pract. Aug. 2005:59(8), pp. 946-949, Blackwell Publishing.

Fagaly, "Squid Detection of Electronic Circuits," IEEE Transactions on Magnetics, vol. 25, No. 2, Mar. 1989, pp. 1216-1218.

Gopee, et al., "Migration of Intradermally Injected Quantum Dots to Sentinel Organs in Mice," Toxicological Sciences, vol. 98(1), Apr. 2007, pp. 249-257.

Gunasekera, et al., "Imaging applications of nanotechnology in cancer," Targeted Oncology, 2009, vol. 4, pp. 169-181.

Kim, et al., "Near-infrared fluorescent type II quantum dots for sentinel lymph node mapping," Nat Biotechnol., vol. 22 (1), Jan. 2004, pp. 93-97.

Noguchi, et al., "Sentinel lymphadenectomy in breast cancer: identification of sentinel lymph node and detection of metastases," Breast Cancer Research and Treatment, vol. 53, 1999, pp. 97-104.

Peleg, et al., "Implementing metal detector technology and a navigation system in the removal of shrapnel," Computer Aided Surgery, Dec. 2009, vol. 14, No. 1-3; pp. 63-68.

Peleg, et al., "Integration of computer-aided navigation and metal detector technology in the removal of shrapnel in terror attacks casualties," 7th Int. Conf. Computer-Aided Orthopaedic Surgery, Heidelberg, Germany, 2007, pp. 57-60.

Soltesz, et al., "Intraoperative Sentinel Lymph Node Mapping of the Lung Using Near-Infrared Fluorescent Quantum Dots," Ann Thorac. Surg., vol. 79(1), Jan. 2005, pp. 269-277 (reproduced from NIH Public Access).

PCT International Search Report and Written Opinion of International Searching Authority for International Patent Application No. PCT/GB2010/002233, mailed Mar. 16, 2011, 15 pages.

English translation of Office action for Japanese patent application No. 2008-508306, dispatched on Nov. 8, 2011, 6 pages.

* cited by examiner

APPARATUS AND METHOD FOR DETERMINING MAGNETIC PROPERTIES OF MATERIALS

FIELD OF THE INVENTION

The present invention relates to arrangements for sensing magnetic properties of materials, and, in particular, to arrangements exhibiting high sensitivity and which can therefore sense extremely small magnetic fields.

BACKGROUND OF THE INVENTION

Sensitive, high-precision methods for measuring magnetic signals (arising from magnetic parameters of one or more entities) are of widespread technological interest in fields as diverse as security tagging, targeted drug delivery, non-destructive evaluation in engineering, and geomagnetic surveying. "Magnetic signals" in this context derive from one or more entities, the magnetic parameters (or properties) of which differ significantly from their environment. Typical examples of entities that would possess a set of characteristic magnetic parameters are a soft magnetic security tag embedded in an item of clothing, clinically introduced magnetic nanoparticles in a human body organ, an air-filled void in a metallic matrix and naturally occurring magnetic minerals in rocks.

The most sensitive methods currently used to measure magnetic signals depend on superconducting quantum interference device (SQUID) technology, which imposes design constraints on the method, and places limits on possible applications. In particular, there is the requirement that the SQUID be kept at very low temperatures, such as 4.2 K, the temperature of liquid helium, in the case of "low-temperature" SQUIDs, or 77 K, the temperature of liquid nitrogen, in the case of "high-temperature" SQUIDs. This requirement presents a major design consideration when most of the magnetic signals of interest arise in materials at room temperature or above.

In a typical sensing arrangement, a SQUID and a signal transduction circuit, in the form of a sensor coil coupled to a transfer coil, are arranged within a single cryostat containing liquid helium or liquid nitrogen. The sensor coil is arranged to sense the magnetic field to be measured, and the transfer coil is positioned proximate the SQUID. The current induced in the sensor coil is supplied to the transfer coil, and the magnetic field associated with the current in the transfer coil is sensed by the SQUID. The transfer coil typically has a substantially greater number of turns than the sensor coil, and this provides a means of amplifying the signal.

Such an arrangement provides the advantage of minimising resistance noise in the signal transduction circuit.

However, a major problem in such an arrangement is that, unless the material under investigation is located within the cryostat, the very small magnetic fields being measured must permeate the wall of the cryostat in order to be sensed by the sensor coil. In such cases, the sensor coil is separated from the magnetic signal source by a distance of typically a centimeter or more to accommodate the vacuum and/or radiation shields surrounding the cryogenic liquid, and this necessarily degrades the signal quality. Furthermore, since the cryostat assembly is bulky and not easily manoeuvrable, it is difficult to locate the signals both flexibly and with reasonable accuracy.

It would therefore be desirable to provide an arrangement which can measure extremely low magnetic fields associated with the magnetisation of a material by using a SQUID but without requiring either that the material be located within the cryostat or that the resulting extremely low magnetic fields penetrate the wall of the cryostat containing the SQUID.

Noise considerations have meant that it has generally been regarded as essential that both the sensor coil and the transfer coil be positioned within the cryostat. Such arrangements ensure that the resistance of the coil is extremely low, or even zero in the case of a superconducting coil, thereby reducing noise levels associated with higher-resistance coils. Making the entire transduction circuit superconducting eliminates all thermal (Johnson) noise.

SUMMARY OF THE INVENTION

In accordance with a first aspect of the present invention there is provided apparatus for determining magnetic properties of materials, comprising: means for applying an alternating magnetic field to a sensing region containing a material; means for sensing a change in a magnetic parameter of the material resulting from the applied alternating magnetic field and for generating a sensor output signal in response thereto; means for conveying the sensor output signal to a remote superconducting quantum interference device (SQUID); and means for receiving an output signal from the SQUID indicative of the sensed magnetisation.

The magnetic parameter would normally be the magnetisation of the material. In this way, the magnetic response indicated by the magnetic signals is normally due to the induced magnetisation of the material, the magnitude of which is determined by the magnetic parameter characterising that response, namely the magnetic susceptibility of the material. However, it should be noted that other magnetic responses may be present, such as those due to induced current flow in an electrically conducting material. While not being per se determined by a magnetic parameter (being rather determined by an electric parameter, the electric conductivity of the material), these are nevertheless magnetic responses.

By using such an arrangement to measure the change in the magnetic parameter resulting from an applied alternating magnetic field, the problems resulting from noise can readily be mitigated, since the desired signal resulting from the induced change in the magnetic parameter, e.g. magnetisation, will have the same frequency as that of the applied magnetic field and can therefore readily be distinguished sufficiently from any noise to provide measurements with an acceptable signal-to-noise ratio. The noise may be both intrinsic random noise and noise at known fixed frequencies of interference.

Thus, the apparatus preferably further comprises noise-reduction means for reducing the effects of noise generated in the conveying means. This is preferably in the form of means for separating from the SQUID output signal a component which results from noise generated in the conveying means, thereby to select the desired component of the SQUID output signal resulting from the sensor output signal. The SQUID can be used in conjunction with an electronic circuit known as a flux-locked loop (FLL), to produce an output signal linearly related to the magnetic field. The noise-reduction means may be in the form of means for separating from the linearised SQUID output signal a component which is correlated with the applied field, substantially rejecting the noise which is uncorrelated with the applied field.

The alternating magnetic field may be applied at a single frequency, in which case the separating means preferably comprises means arranged to select only that component of the SQUID output signal having a frequency substantially equal to that of the applied alternating magnetic field. However, the alternating magnetic field may alternatively be applied at a plurality of frequencies, or even a continuous spread of frequencies, in which case the separating means is arranged to select only that component of the SQUID output signal having a frequency or frequencies substantially equal to at least one of the plurality of frequencies, or a frequency within the continuous spread of frequencies, of the applied magnetic field. In either case, the separating means can take the form of a lock-in amplifier or digital cross-correlator for each component.

The alternating magnetic field may be applied at a plurality of frequencies in sequence or simultaneously, or swept across a continuous spread of frequencies, in which case the separating means is arranged to select only components of the SQUID output signal having an instantaneous frequency or frequencies substantially equal to at least one of the frequencies of the applied magnetic field.

Means are preferably additionally provided for detecting a phase shift between the applied alternating magnetic field and the sensed magnetisation. The phase shift can also be measured as well as detected. This is particularly useful when studying magnetisation in liquids, in which there is typically a phase lag between the applied field and the resulting magnetisation, and a knowledge of the phase lag provides useful information relating to the material. It is also useful in discriminating between magnetic and electric properties.

The magnetic response, while normally being determined by a magnetic parameter such as the magnetic susceptibility of the material, can be confused with the magnetic response due to an electric parameter such as the electric conductivity of a metal, via the magnetic field generated by electrical eddy currents. Measurement of the phase shift can be used to distinguish these two sources, since the induced electrical eddy current is proportional to rate of change of the applied field, while the induced magnetisation is proportional to the magnitude of the applied field.

The field-applying means and the sensing means are conveniently disposed on a portable probe. This enables measurements to be made in a wide range of environments. Furthermore, the portable probe is preferably arranged to be selectively disconnected from the conveying means, since this enables different probes which are suited to different applications to be selectively connected to the same conveying means.

The frequency of the applied magnetic field is preferably within the range 150 Hz to 20 kHz, and preferably substantially 2 kHz. The use of frequencies lower than 150 Hz does not provide enough data in a given time for suitable signal-averaging techniques to be applied, and also give rise to a reduced coupling between the sensing means and the SQUID and poorer discrimination against mains frequency interference. Furthermore, the use of frequencies above 20 kHz typically requires undesirably high voltages to be applied to the field-applying means because of the high inductive impedance, and such high frequencies are recognised as being unsuited to medical applications. The frequency is preferably chosen so as not to be a multiple of the local mains frequency. The value of 2 kHz is particularly suited to medical applications.

Means are preferably provided for varying the amplitude of the applied alternating magnetic field, and means are preferably provided for varying the spatial distribution profile of the applied magnetic field. These options enable a wide range of measurements to be made with the apparatus, such as depth profiling. Varying the amplitude may be used as a control of sensitivity.

The means for applying an alternating magnetic field is conveniently in the form of a drive coil, and means are preferably provided for applying to the two terminals of the drive coil respective alternating voltages which are in antiphase with each other. This arrangement provides the advantage of reduced electrostatic interference resulting from the drive voltages on the supply lines, since the voltages in the two supply lines at any instant are substantially equal and opposite. Furthermore, the resulting voltage applied to the drive coil is twice the amplitude of the voltages on the supply lines.

Means are preferably provided for generating a correcting magnetic field for causing the sensor output to be substantially zero in the absence of a magnetic material within the sensing region. "Sensor output" in this context refers to the ac amplitude of the linearised output signal from the SQUID/ FLL. This may take the form of a correction coil, which is preferably supplied with current, thereby to create a magnetic field in the correction coil which opposes the magnetic field created by the drive coil. The current is preferably set so that the magnetic field from the correction coil which links the sensor coil balances the magnetic field from the drive coil which links the sensor coil. Alternatively, this may take the form of a correction signal supplied direct to the SQUID via a dedicated transfer coil.

The sensing means preferably comprises a sensor coil, which preferably comprises a central region containing substantially one half of the total number of turns of the coil and two side regions each containing substantially one quarter of the number of turns of the coil and wound in opposition to the turns of the central region. Such an arrangement gives rise to a zero output in response to a homogenous magnetic field in the region of the sensor.

The above arrangement of sensor coil constitutes a second-order gradiometer. However, first-, second- or even higher-order gradiometers may be appropriate, depending on the application and environment.

More precisely, the sensing means preferably comprises a sensor coil circuit in which more than one coil is connected in series to form a gradiometer. The simplest first-order gradiometer configuration consists of two coils of equal size and number of turns, axially displaced and connected in opposition to each other. Such an arrangement gives rise to a zero output in response to a uniform magnetic field in the region of the sensor. A second-order gradiometer also has a zero response to a uniform field gradient. Depending on the application and environment, first-, second- or even higher-order gradiometers may be appropriate. In general, higher order gradiometers have reduced sensitivity to remote sources of field.

When the field-applying means comprises a drive coil and the sensing means comprises a sensor coil, the drive coil is preferably arranged substantially coaxially about the sensor coil and substantially at the centre thereof.

Relative movements between the drive coil(s) and sensor coil(s) in the portable probe can create false indications of magnetic responses, because of the extreme sensitivity. Small movements can occur due to applied forces, including the varying effect of gravity on the probe as it is tilted, and due to thermal expansion. A variety of measures are preferably employed to mitigate such effects:

Use of a material for the probe structure having high stiffness and low coefficient of thermal expansion, such as Macor (machinable ceramic).

Design of structure shape for stiffness, in particular to give good support for relatively heavy copper drive coils.

Application of a flexible layer of thermal insulation, to avoid hot spots created by contact with user's hand or with patient.

Use of certain symmetrical arrangements of coils where overall thermal expansion of the structure has no net effect, for instance a single drive coil attached centrally to an odd order gradiometer.

Addition of extra coils to compensate specific distortions, for instance additional small sensor coils mounted close to a drive coil can nullify the effect of small movements of the drive coil along the axis of the sensor coils.

The invention extends to arrangements in which the field-applying means and the sensing means comprise a plurality of probes. Such probes could have different characteristics, e.g. arranged to generate different strengths of magnetic field, and/or could be arranged in the form of a portable array, which would enable the spatial variation of magnetisation to be measured.

The means for conveying the sensor output signal to the remote SQUID preferably comprises a length, preferably greater than one meter and preferably about 2 meters, of low-resistance electromagnetically self-shielding cable. The length of 2 meters is advantageous in allowing reasonable flexibility of use, and the low resistance serves to minimize thermal noise. The cable is preferably screened to minimize electrostatic and radiofrequency interference and has four conductors, twisted along their length, instead of the conventional two conductors, thereby allowing signal and return paths to be interleaved so as to minimize magnetic coupling of interfering fields. A preferred cable is Belden 1192A microphone cable. The means for conveying the drive current to the drive coil is preferably the same or similar type of cable, in this case to avoid generating interference.

In accordance with a further aspect of the present invention there is provided a method of measuring magnetic properties of a material comprising: applying an alternating magnetic field to a sensing region containing the material; sensing the resulting change in a magnetic parameter of the material and generating an output signal in response thereto; conveying the output signal to a remote superconducting quantum interference device (SQUID); and receiving an output signal from the SQUID indicative of the sensed magnetisation.

The method preferably further comprises the step of reducing the effects of noise generated in the step of conveying. This noise may take the form of thermal noise and also environmental noise, such as mains pick-up. This step may take the form of separating from the SQUID output signal a component which results from noise generated in the step of conveying; and thereby selecting the desired component of the SQUID output signal resulting from the sensor output signal. The noise reducing step may take the form of separating from the linearised SQUID output signal a component which is correlated with the applied field, substantially rejecting the noise which is uncorrelated with the applied field.

The alternating magnetic field may be applied at a single frequency, in which case the step of separating preferably comprises selecting only that component of the SQUID output signal having a frequency substantially equal to that of the applied alternating magnetic field. However, the alternating magnetic field may alternatively be applied at a plurality of frequencies, or even a continuous spread of frequencies, in which case the step of separating selects only that component of the SQUID output signal having a frequency or frequencies substantially equal to at least one of the plurality of frequencies, or a frequency within the continuous spread of frequencies, of the applied magnetic field.

The method preferably further comprises the step of applying a correcting magnetic field to the sensing region or directly to the SQUID for causing the output signal to be substantially zero in the absence of a magnetic material within the sensing region.

The method can advantageously be applied to materials at non-cryogenic temperatures such as room temperature.

Thus, in the preferred embodiments of the present invention, a sensitive, high-precision method for measuring magnetic signals using a room-temperature sensor coil coupled into a SQUID is provided, with the following advantages:

The apparatus is in the form of a susceptometer/relaxometer, which measures changes in magnetic parameters resulting from an applied alternating magnetic field. This permits greater freedom in selective sensing than is possible with arrangements which simply measure the intrinsic magnetisation of materials. For example, such arrangements do not permit the determination of depth-versus-concentration profiles of magnetic materials. Preferred embodiments of the present invention provide such a depth selectivity through the ability to drive the applied magnetic field at a range of strengths and spatial distribution profiles which, when coupled to the measured parameters, can be deconvoluted to determine the depth-versus-concentration profile. Furthermore, the susceptometer/relaxometer methodology allows a distinction to be made between spatially and/or temporally static and dynamic magnetic entities, which gives rise to the possibility of many applications not currently achievable, such as the study of magnetically tagged pharmaceuticals to determine bio-distribution pathways and pharmacokinetics.

Furthermore, methods according to the preferred embodiments of the present invention use a SQUID coupled to a signal transduction circuit which contains a room-temperature sensor coil which is light and highly manoeuvrable, and preferably portable, and which can be positioned in close proximity to the material being measured. In addition, the signal transduction circuit comprises a sensor coil and drive coil assembly and a transfer coil and SQUID assembly, the two assemblies being connected by a low-resistance, electromagnetically self-shielding electrical cable, so that the assemblies may be separated by a distance of several meters. This makes it feasible to use such methods to scan for magnetic signals on large irregularly shaped objects, which would otherwise not be possible.

Furthermore, the preferred methods use a combined sensor coil and drive coil probe which optimally locates the sensor coil in relation to the applied magnetic field so as to maximise the signal received in the sensor coil, to maximise the longitudinal extent of the region being sampled and to maximise the transverse spatial resolution.

Furthermore, the preferred method uses a probe which can be positioned remotely from the other components of the signal transduction circuit, which permits a high degree of flexibility and a thereby a wide range of applications. An example of an application involving the use of two different probes would be the use of the first probe to conduct a low-spatial-resolution survey of a large object (e.g. looking for magnetic parameters due to defects in a large steel object), and subsequently, once a region of interest has been located and marked, the second probe could be used which is optimised for a high-spatial-resolution survey of that region.

The preferred methods also permit room-temperature sensor coil geometries of a scale and complexity that would be unfeasible with conventional instruments. Thus, in a preferred embodiment, the probe is in the form of a segmented array of sensor coils which may be operated either in concert to provide a large-area scan, or individually and sequentially to allow signal triangulation and three-dimensional depth-profile imaging. In another embodiment, the probe is in the form of a miniaturised and/or axially symmetric or concentric arrangement of sensor coils arranged to deliver optimal spatial resolution in the transverse plane.

In accordance with yet a further aspect of the present invention, there is provided a probe for detecting magnetic properties of materials, comprising: a rod having a longitudinal axis and an exterior surface about the longitudinal axis; a sensor coil wound circumferentially on the rod about its longitudinal axis; a former assembly disposed on the rod circumferentially about the longitudinal axis of the rod; and a drive coil wound circumferentially on the former assembly about the longitudinal axis of the rod, wherein the drive coil is spaced by the former assembly a distance from the exterior surface of the rod.

Preferably, the probe comprises: a winding surface for supporting the drive coil having an axis which is perpendicular to a plane in which the drive coil is supported, wherein the axis of the winding surface and the longitudinal axis of the rod are co-axial.

There may be at least one arm disposed between the winding surface and the surface of the rod.

In one embodiment of the present invention, the sensor coil comprises a central region containing substantially one half of the total number of turns of the coil and two side regions each containing substantially one quarter of the number of turns of the coil and wound in opposition to the turns of the central region. Preferably, the sensor coil is in the form of a second-order gradiometer.

In an alternative embodiment of the invention the sensor coil comprises a first set of windings arranged on the rod each side of a second set of windings, wherein the first and second sets of windings are arranged each side of the former assembly. The first set of windings is a pair of windings. The second set of windings is a second pair of windings which is positioned on the same longitudinal axis between the first pair of windings. The first set of windings (outermost pair) are arranged symmetrically each side of the drive coil/former assembly.

Advantageously, one of each pair of the second set of windings is disposed each side of the former assembly. The second set of windings (innermost pair) are arranged symmetrically each side of the drive coil/former assembly.

The first set of windings may be in the form of a first order gradiometer and the second set of windings may also be in the form of a first order gradiometer.

Preferably, the first set of windings should be connected to the second set of windings in such a way that a signal generated by the second set of windings is subtracted from a signal generated by the first set of windings, thereby generating a signal from the sensor coil which compensates for longitudinal movement of the drive coil along the rod.

Mechanical distortion of the probe (for example by thermal or mechanical variations) can alter the coupling between the drive and sensor coils. Since the nominal arrangement between the sensor and drive coils is centrally symmetric, thermal expansion of the drive coil or the rod has no net effect on the output signal of the sensor coil. Secondly, when the sensor coil comprises a second set of windings between a first pair of windings, this second set of windings can be used as a compensation coil of the sensor coil to reduce the effect of movement of the drive coil along the longitudinal axis of the rod. This is done by connecting the first and second sets of windings so that the signal generated by the second set of windings is subtracted from the signal generated by the first set of windings, thereby generating a compensated signal for the sensor coil. This can be achieved by connecting to the windings in series down the length of the rod, whilst alternating the direction of winding of each of the windings in turn.

In one embodiment of the invention, each set of windings in the first pair of windings is centred at ±30 mm along the rod from the drive coil/former assembly and has 32 turns in each set of windings. Each set of windings in the second pair of windings is centered at ±15 mm along the rod from the drive coil/former assembly and has 20 turns in each set of windings. The former assembly is dimensioned to ensure that the drive coil has a diameter of 60 mm.

BRIEF DESCRIPTION OF DRAWINGS

Preferred embodiments of the present invention will now be described in detail with reference to the accompanying drawings, in which.

DETAILED DESCRIPTION OF THE DRAWINGS

Figure 1:
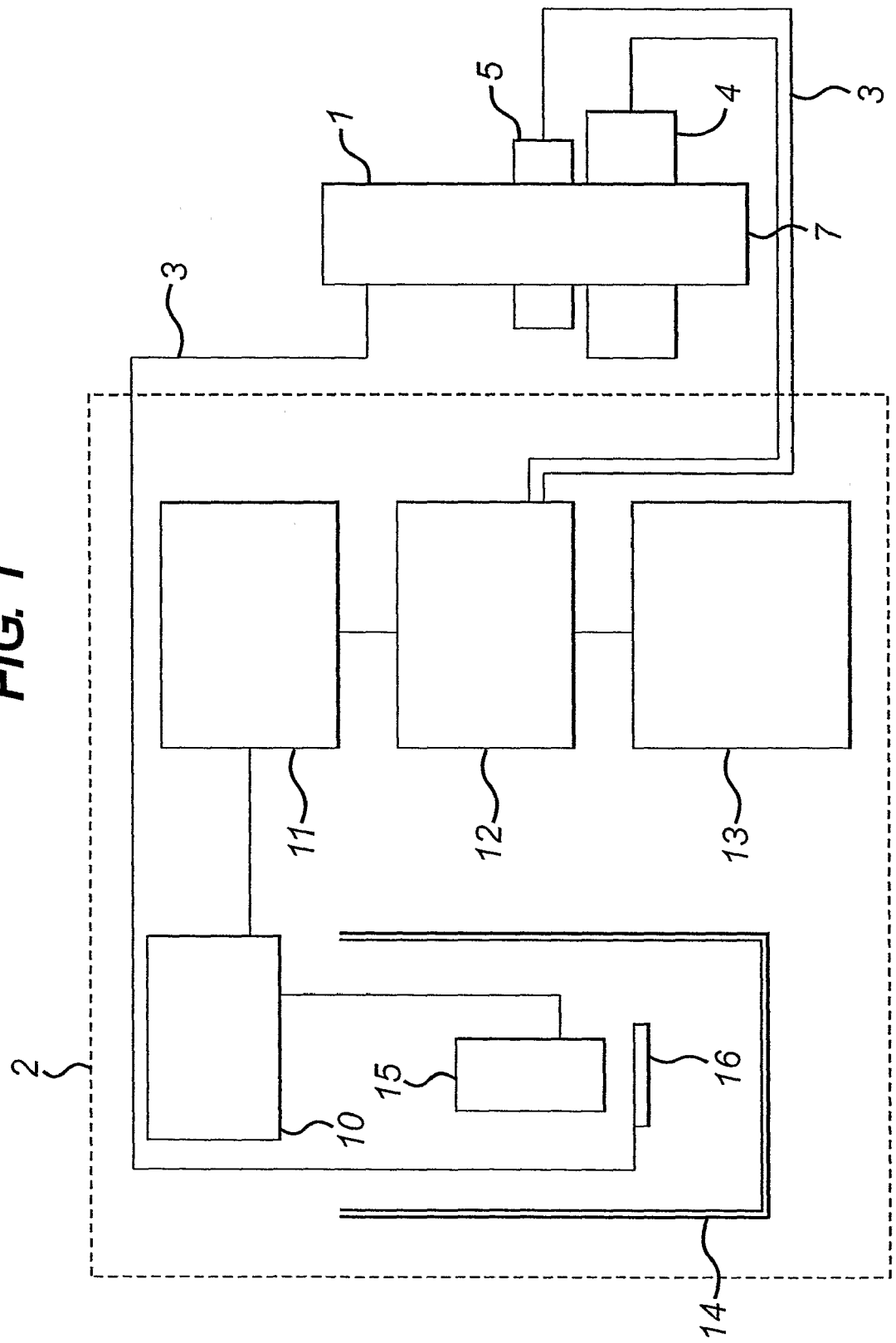
FIG. 1 is a schematic block diagram of one embodiment of a sensitive, high-precision method for locating and characterising magnetic signals.

Referring to FIG. 1, an instrument according to one embodiment of the present invention comprises of a hand-held probe 1, an equipment trolley 2 holding cryogenics and electronics, and electrical cables 3 connecting the two. The hand-held probe 1 is made of PEEK (poly-aryl-ether-ether-ketone), a semi-crystalline thermoplastics material. PEEK is a tough, low-density material which can be sterilized by autoclave, gamma irradiation or ethylene oxide. Its melting point is 343° C.

Figure 2:
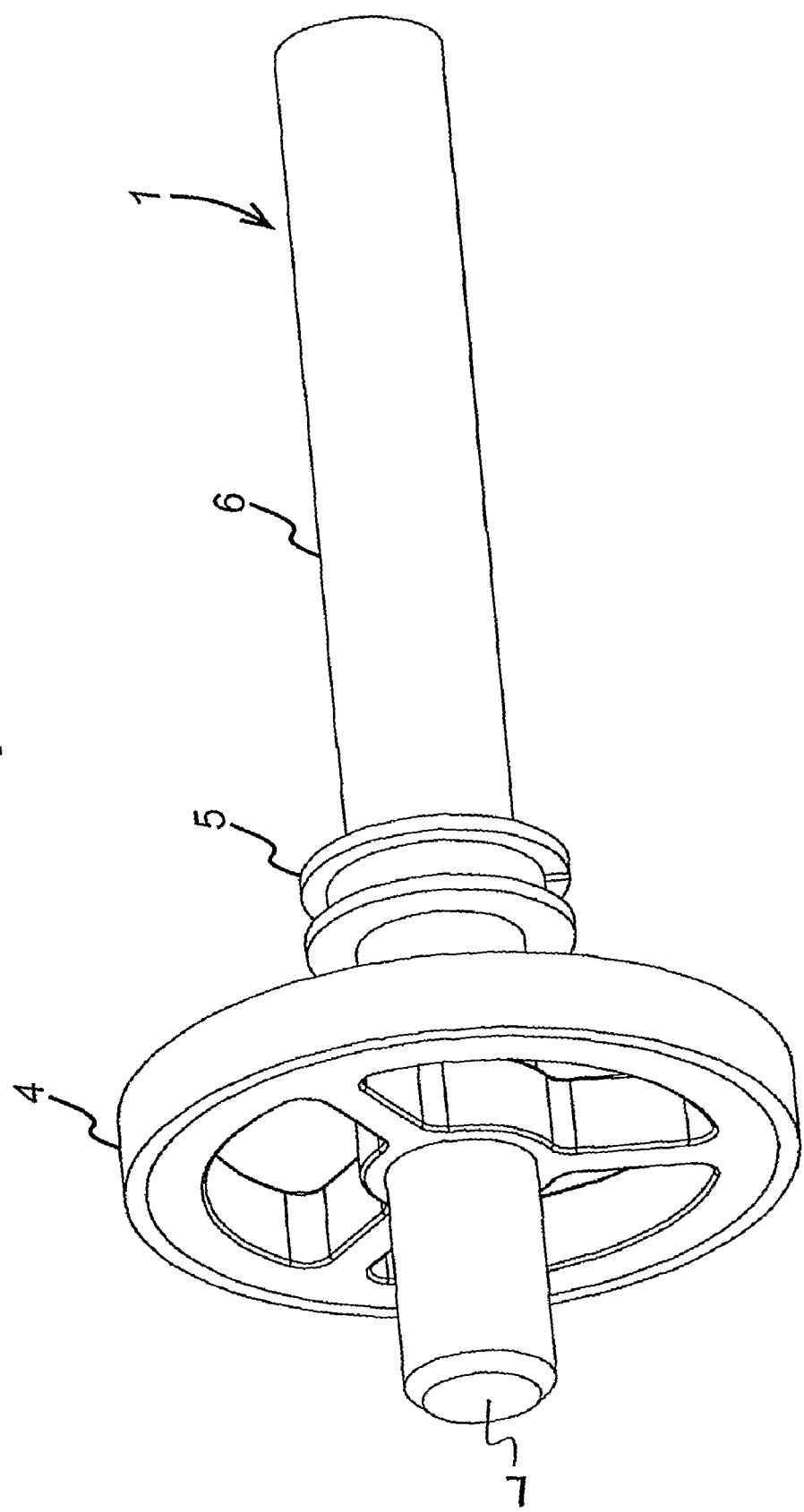
FIG. 2 is a perspective drawing of a non-limiting example of a sense-coil/driving-coil probe in accordance with the embodiment of FIG. 1.
Figure 3:
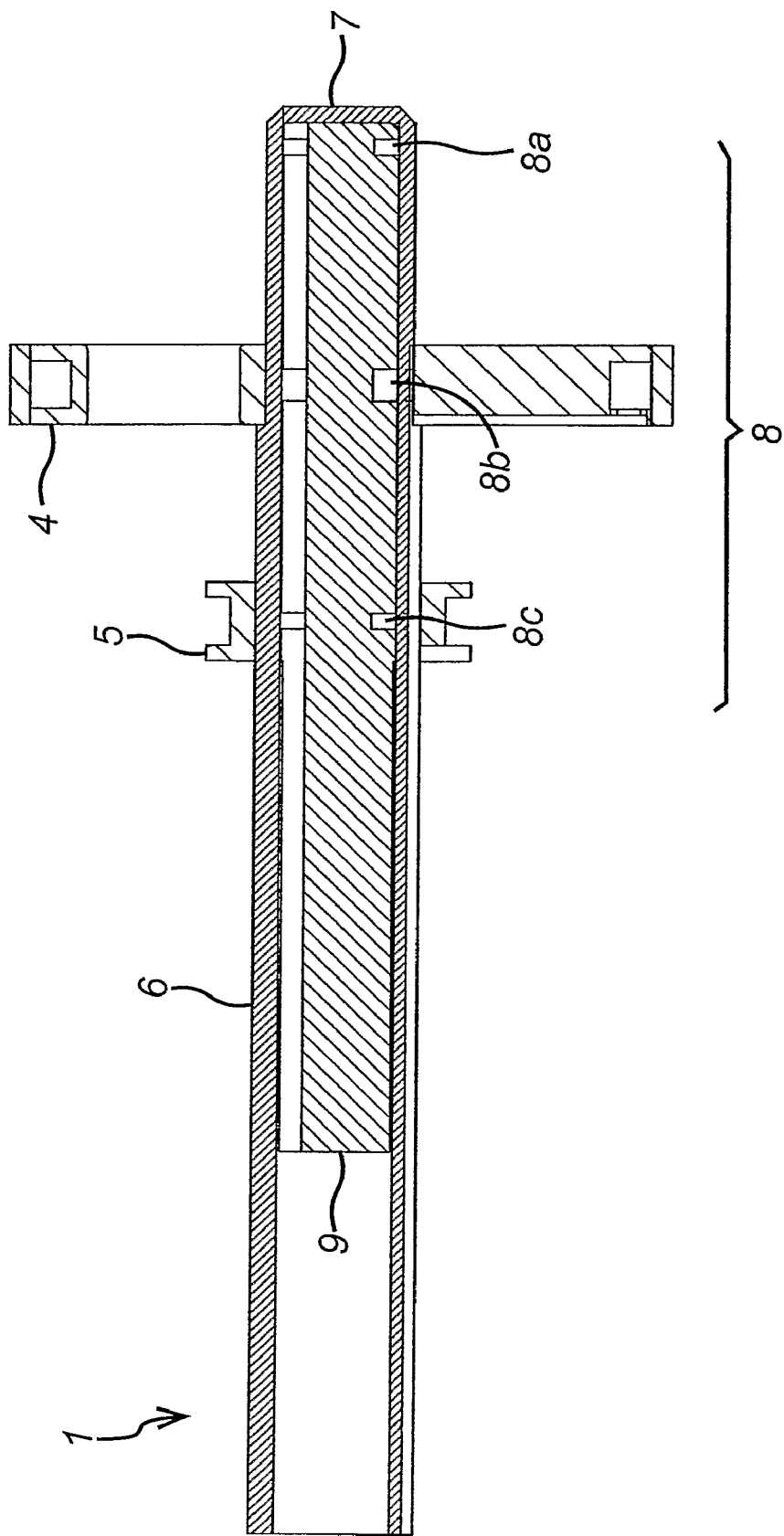
FIG. 3 is a cross-sectional engineering drawing of the probe of FIG. 2.

Referring to FIGS. 2 and 3, the probe 1 is in the form of a hand-held rod, like a thick pen with a diameter of about 20 mm. A drive coil 4 and a correction coil 5 are attached to an outer former assembly 6 attached like a halo near the sensing end 7. The drive coil 4 is symmetrically disposed with respect to an inner second-order gradiometer sensor coil 8. The sensor coil 8 is wound from polyurethane-coated copper wire, and parts are glued with epoxy adhesive.

The sensor coil 8 is a second-order gradiometer comprising a set of three sub-coils 8a, 8b and 8c wound on a cylindrical bobbin 9 which fits inside the drive coil 4, which itself is wound on a cylindrical bobbin 6. The central sub-coil 8b comprises one half of the total number of turns of the sensor coil 8, and each of the two outer sub-coils 8a and 8c comprises one quarter of the total number of tunas, each would in opposition to the turns of the central sub-coil 8b.

The drive coil 4 is positioned at the central point of the sensor coil 8, and the correction coil 5, also wound on the cylindrical bobbin 6, is driven so as to apply a compensating field, thereby enabling the signal at the sensor coil 8 arising from the drive coil 4 to be nullified, thereby maximising the sensitivity and precision of the probe 1.

The electrical cables 3 are low-resistance, electromagnetically self-shielding electrical cables, such as Belden 1192A microphone cables, sheathed in PVC (poly-vinyl chloride) and are of diameter 6.2 mm and length around 2 m. The cables 3 are sufficiently long to enable the equipment trolley 2 to be maintained at a distance from the probe 1 to reduce mains frequency magnetic interference at the probe 1. Three cables 3 are used to connect the drive coil 4, the correction coil 5 and the sensor coil 8. There are some soldered connections, protected by polyolefin heat-shrink sleeving.

The drive coil 4 is driven with a 2 kHz sine wave current at a peak of up to 2 A (rms current 1.4 A). The voltage across the coil is about 12 V rms. The power dissipated in the coil is up to 1.7 W. The drive coil 4 generates a magnetic field varying sinusoidally at a frequency of 2 kHz. The magnetic field strength at the tip 7 of the probe 1 has a value of about 0.5 mT rms. This gives a maximum rate of change of field of 8.35 T $s^{-1}$, which is below the control level of 20 T $s^{-1}$ set by the Radiation Protection Division of the UK Health Protection Agency, and which thereby avoids peripheral nerve stimulation. By way of comparison, the maximum field obtained in contact with the flex of an electric kettle is around 4 mT rms.

The correction coil 5 is also supplied with a 2 kHz sine wave current, but in antiphase with the current supplied to the drive coil 4. The position of the correction coil 5 along the probe 1 is adjusted until the output signal from the sensor coil 8 is zero in the absence of a sample near the end of the probe 1. However, adjustment is likely to be achieved in practice by a combination of positional adjustment, manual current adjustment and computer-controlled fine adjustment.

The drive electronics are designed to avoid generating a static magnetic field component, i.e. they do not generate a dc current. The electronics are powered from the mains supply and comprise a flux-locked loop 10, a SQUID controller 11, a data acquisition module 12, which includes a lock-in amplifier and which captures and processes the signals and a notebook personal computer 13.

A cryostat in the form of a liquid-nitrogen dewar 14 is supported on the equipment trolley 2. The dewar 14 houses a sensitive SQUID detector 15 and a transfer coil 16. The transfer coil 16 is made from copper, the resistance of which at 77 K is so low that it is an insignificant contributor to the total resistance of the signal transduction circuit. However, the transfer coil 16 could alternatively be made from a superconducting material.

Figure 4:
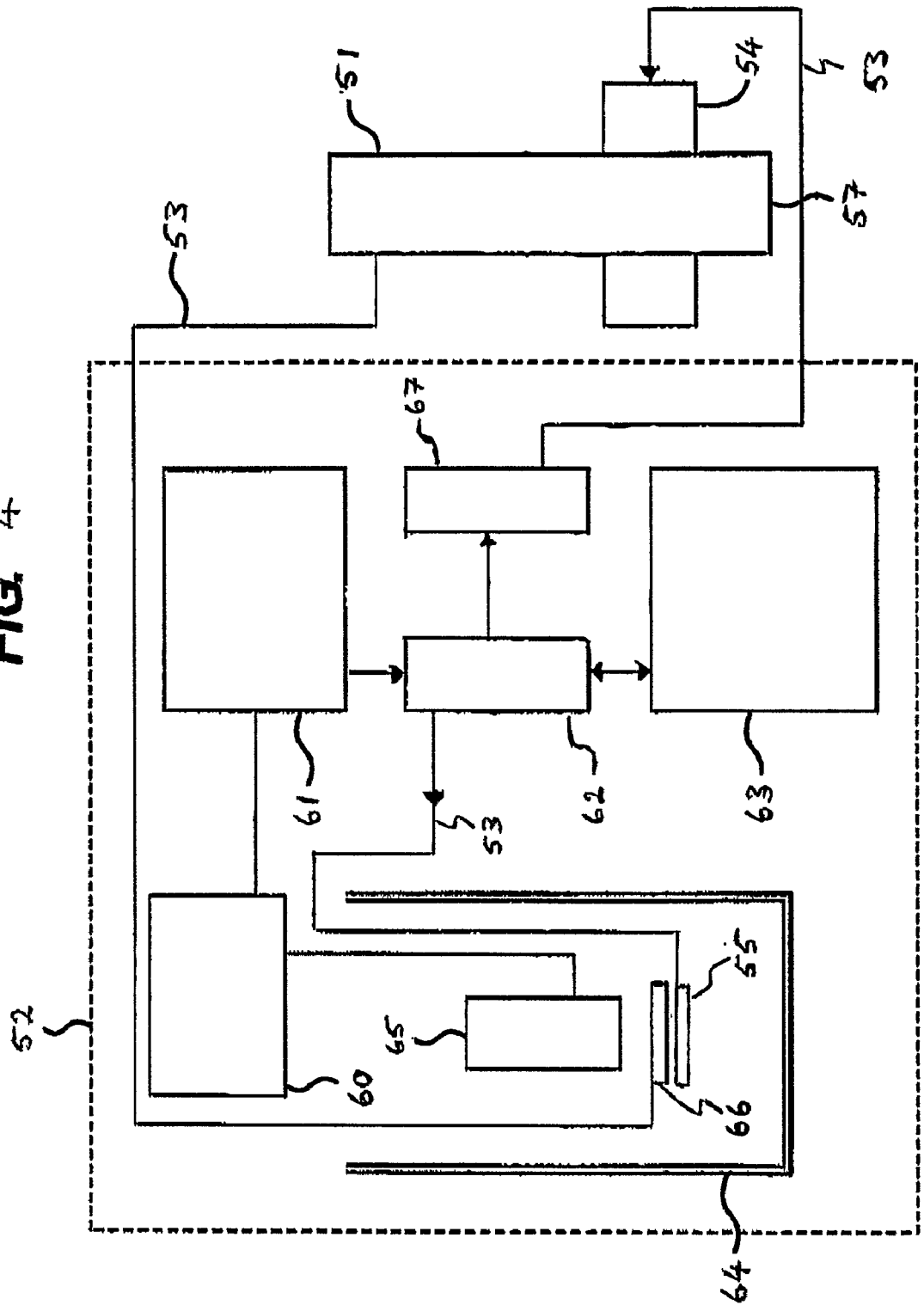
FIG. 4 is a schematic block diagram of an alternative embodiment of a sensitive, high-precision method for locating and characterising magnetic signals.

Referring to FIG. 4, an instrument according to a second embodiment of the present invention comprises of a hand-held probe 51, an equipment trolley 52 holding cryogenics and electronics, and electrical cables 53 connecting the two. The hand-held probe 51 is made of Macor, a machinable glass ceramic made by Corning. It is very stiff (Young's modulus 67 GPa, shear modulus 25 GPa), has a low coefficient of thermal expansion ($9.3 \times 10^{-6}$/K) and can be machined to a tolerance of better than 15 µm. Macor is rated for continuous operation at temperatures up to 800° C., and is highly resistant to chemical attack by both acid and alkali.

Figure 5:
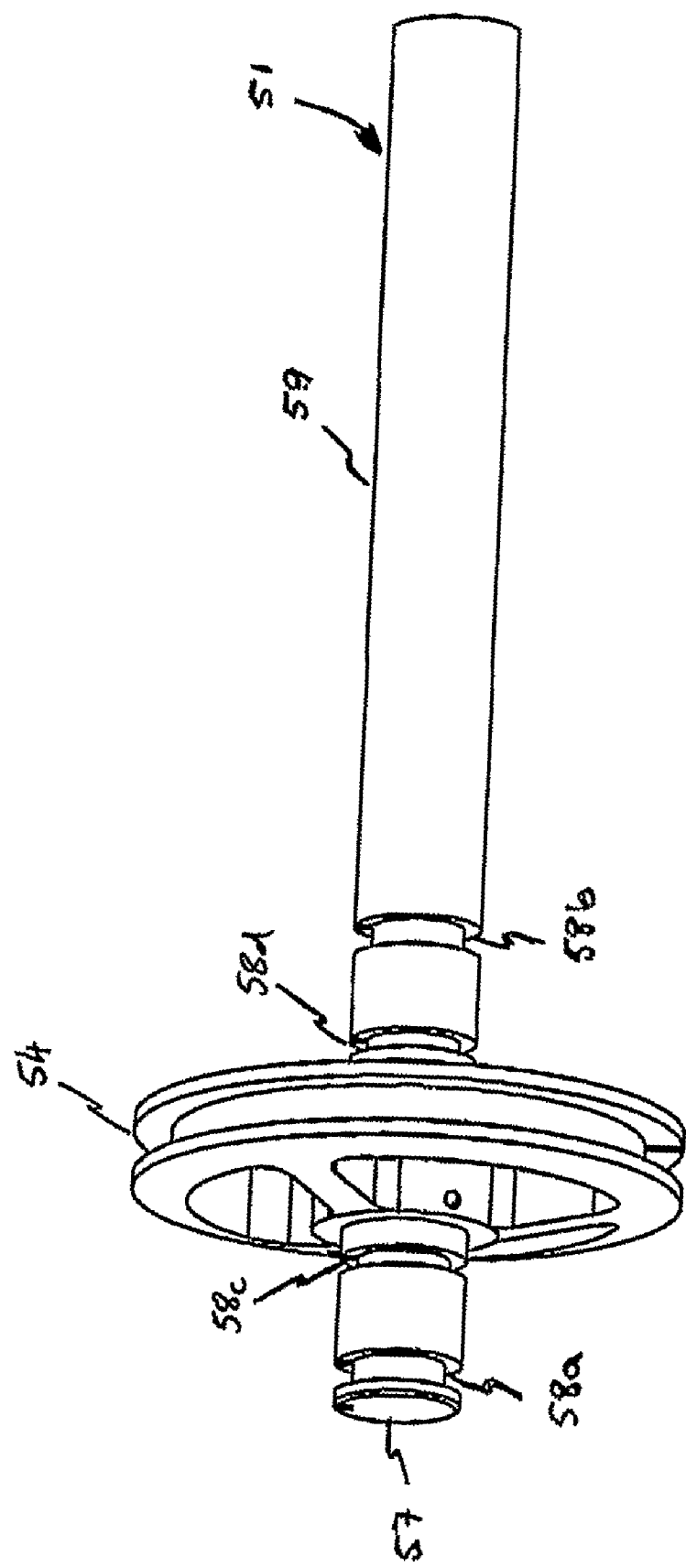
FIG. 5 is a perspective drawing of a non-limiting example of a sense-coil/driving-coil probe in accordance with the embodiment of FIG. 4.
Figure 6:
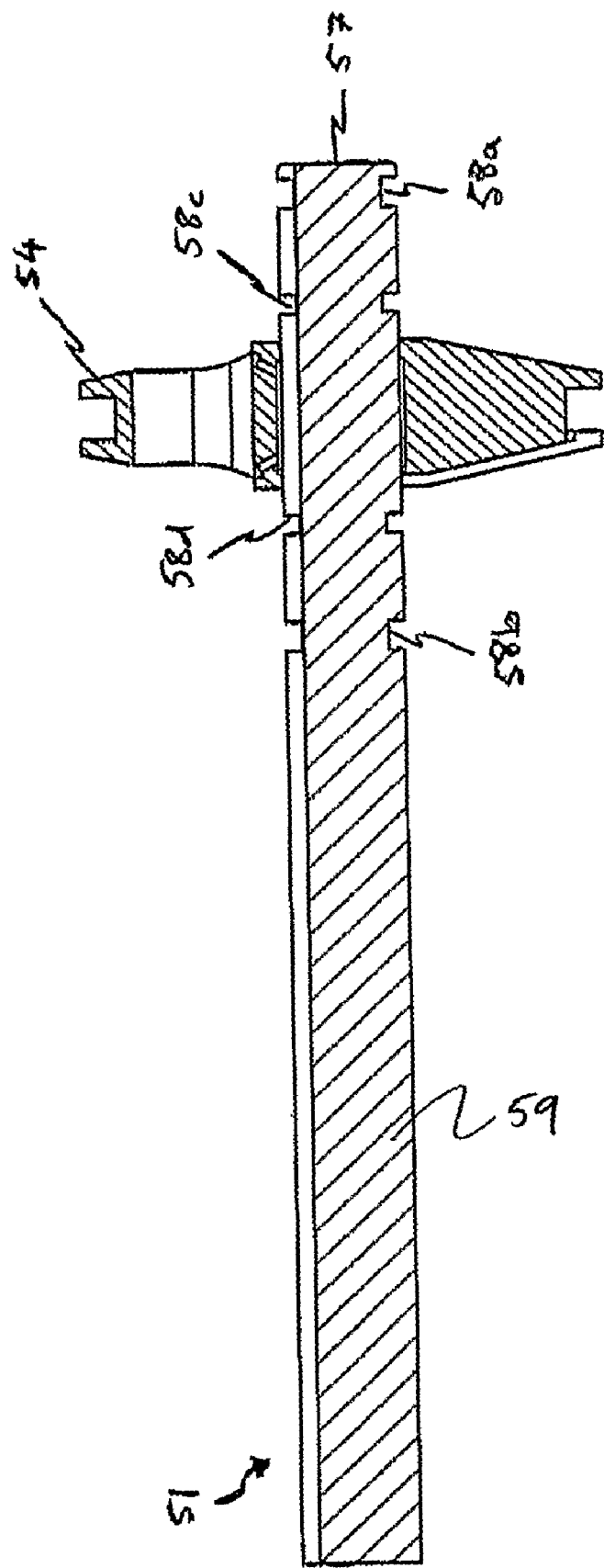
FIG. 6 is a cross-sectional engineering drawing of the probe of FIG. 5.

Referring to FIGS. 5 and 6, the probe 51 is in the form of a hand-held rod 59, like a thick pen with a diameter of 15 mm. A drive coil 54 is attached to rod 59 like a halo near a sensing end 57. The drive coil 54 is symmetrically disposed with respect to a set of coils wound on rod 59. First coils or windings 58a, 58b form a first-order gradiometer. Second coils or windings 58c, 58d, which act in opposition to coils 58a, 58b, have a smaller number of turns and act to compensate for the effect of any movement of the drive coil 54 along the axis away from the ideal symmetrical position. First coils 58a, 58b and second coils 58c, 58d are wired in series to form a sensor coil 58. Preferably the sensor coil 58 is wound from a single length of insulated wire to avoid joints. The wire runs along the shaft to and between the coils in a machined slot as a twisted pair. The sensor coil 58 is wound from polyurethane-coated copper wire, and parts are glued with epoxy adhesive.

A cryostat in the form of a liquid-nitrogen dewar 64 is supported on the equipment trolley 52. The dewar 64 houses a sensitive SQUID detector 65, a transfer coil 66 and a correction coil 55. The dewar 64 is shielded against radio-frequency interference with layers of aluminium foil. Additionally the SQUID and coils are mounted within a magnetic shield consisting of a cylinder of high-temperature superconductor. The transfer coil 66 is made from copper, the resistance of which at 77 K is about one seventh of that at room temperature, so it makes only a small contribution to the total resistance of the signal transduction circuit. The electronics are powered from the mains supply and comprise a flux-locked loop 60, a SQUID controller 61, a data acquisition module 62, the power amplifier 67 and a notebook personal computer 63. The data acquisition module is used for simultaneous waveform generation and capture, under control of the notebook computer. Phase-sensitive digital cross-correlation is performed in software on the computer, which generates visual and audible outputs indicating the strength of the magnetic response.

The electrical cables 53 are the same specification as the electrical cables 3 of the first embodiment of the invention described above. The type of cable (professional quality microphone cable) is selected for its excellent electric and magnetic screening, low resistance per unit length and superior flexibility. The same cable type is used for carrying the energizing current from the power amplifier 67 to the drive coil 54, for carrying the signals from the sensor coil 58 to the dewar 64 on its way to a transfer coil 66, and for carrying a correction signal from the data acquisition module 62 to the dewar 64 on its way to the correction coil 55. In the case of the output drive, this is to reduce generation of interference, in the case of the input signals to reduce acceptance of interference.

The drive coil 54 is driven by power amplifier 67, which acts as a voltage-to-current converter and has a balanced differential output. The advantage of using a current drive is that the magnetic field produced in the drive coil 54 does not depend on coil or cable impedance, and especially on the change of resistance with temperature. The advantages of using a balanced differential output are that the voltage at the probe is halved, the dissipation in the power amplifier is reduced and generation of electrostatic interference is eliminated. The waveform is a synthesised sine wave, frequency 2025 Hz, which is generated by the notebook computer 63 using the data acquisition module 62. The peak drive current is 2 A.

The correction coil 55 is driven via a series resistor from the data acquisition module 62. Only a small current is required as the coil is positioned close to the SQUID. The correction waveform is locked to the drive waveform, i.e. the coil is driven at the same frequency and at a fixed phase relationship. The amplitude and phase of the correction waveform are adjusted to give zero output in the absence of magnetic materials in the sensing region.

Product Examples

Two examples of application of the present invention which make use of the sensitive and high-precision location and characterisation of magnetic signals are discussed below.

An Intra-Operative Tool for Sentinel Lymph Node Detection in the Treatment of Breast Cancer The sentinel node is the first lymph node to receive drainage from a cancer-containing area of the breast. If the sentinel node is normal, then it is likely that the cancer has not spread, so no further surgery is required and side-effects are avoided. For this reason, intra-operative sentinel node detection and biopsy is the standard of care for breast cancer treatment. The bulk of lymph drainage from the breast is to the axilla (armpit area). The lymph nodes are typically 8 to 10 mm in diameter and not more than 20 mm deep (30 mm would be unusual). The pattern of drainage and location of lymph nodes varies between individuals.

Currently, sentinel node detection is typically performed by injecting a blue dye and a radioactive tracer into the skin over the tumour. The fluid takes about 2 minutes to reach the sentinel lymph node, and a radioactivity detector can then be used to pick out its approximate location. Once an incision is made, the blue dye can be seen staining the lymph node, delineating the tissue to remove. The main problem with radioisotopes in surgery is the radiation dose received by both the patient and the surgeon. As well as this, regulations may require surgeons to undergo special training in their use, and require them to perform a certain frequency of such procedures to maintain their certification. A separate problem is the requirement for the dye. If it becomes necessary to cut near the injection site, the blue dye can make it difficult for the surgeon to see what he or she is doing, and can conceal bleeding.

The product example of the invention, in this case, would be an intra-operative tool for sentinel lymph node detection in the treatment of breast cancer. Regulatory-approved magnetic nanoparticles (such as the 5 nm iron oxide nanoparticles commonly used as intravenous magnetic resonance imaging contrast agents) would be injected subcutaneously into a tumour, and given a few minutes to drain into the lymph. The surgeon would then use apparatus of the preferred embodiment of the present invention to detect and locate the accumulated magnetic nanoparticles in the sentinel node. In this way the magnetic particles would serve the same function and replace the use of radioisotopes. The product could be designed to produce an audible tone of increasing pitch and volume as the density of nanoparticles in the sensing volume increases. This would mean that the surgeon would not have to look at a display to locate peak response. In use the probe would be covered with a disposable plastic sheath, so there would be no direct contact with the patient.

Although the product usage just described would still involve the use of the blue dye, the method would allow for a further innovation in the use of e.g. a fluorescent dye that would only become visible under ultra-violet light illumination, and which could be coated onto the magnetic nanoparticles themselves.

Figure 7:
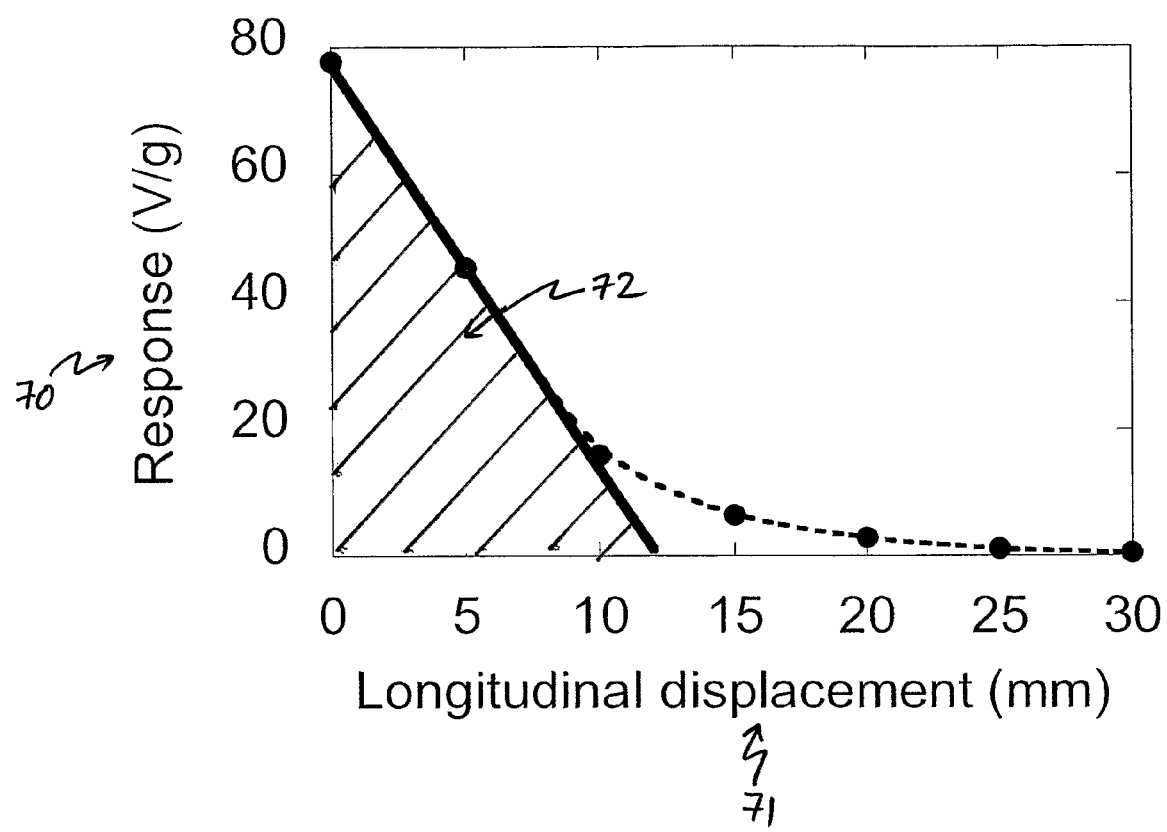
FIG. 7 is a graph of an output signal of the present invention in accordance with the embodiment of FIG. 4 as a function of longitudinal displacement of the probe from a test sample of 1.7 mg of 5 nm diameter iron oxide nanoparticles.
Figure 8:
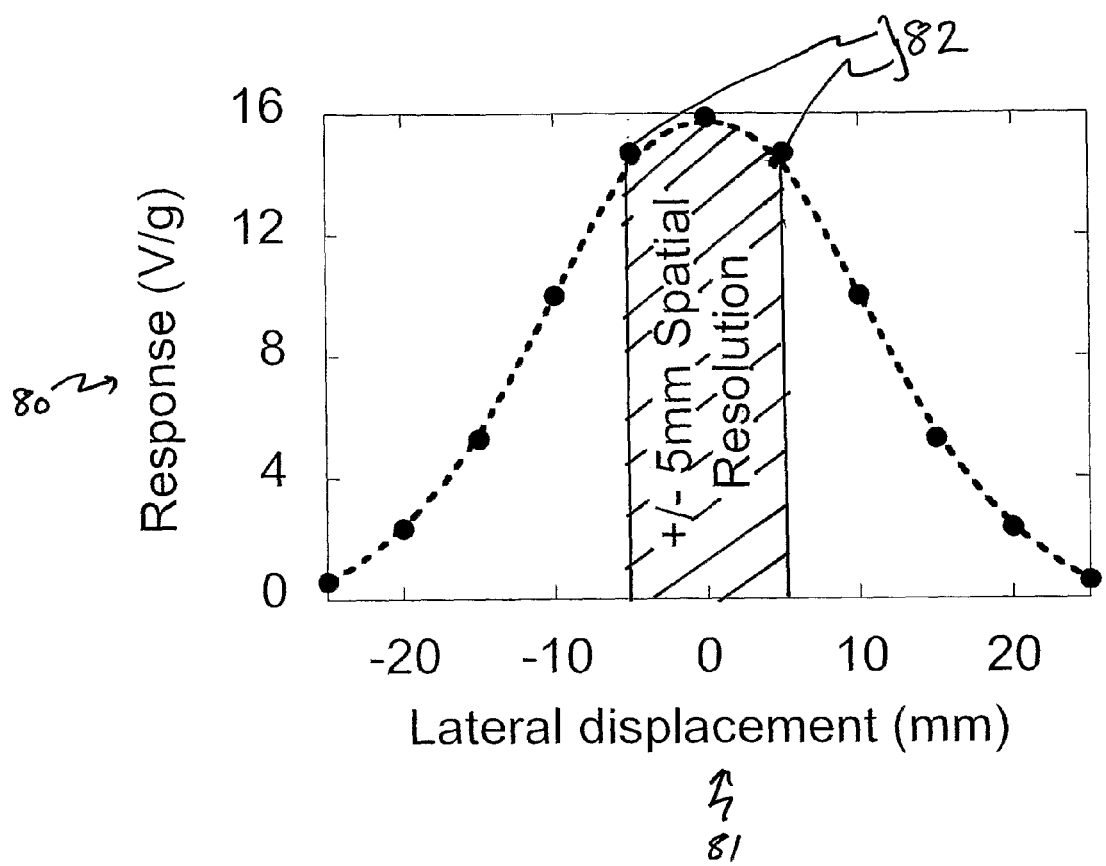
FIG. 8 is a graph of the output signal of the present invention in accordance with the embodiment of FIG. 4 as a function of lateral displacement of the probe (at a constant longitudinal displacement of 10 mm) from a test sample of 1.7 mg of 5 nm diameter iron oxide nanoparticles.

Referring to FIGS. 7 and 8, in both cases the data were collected in accordance with the embodiment of FIGS. 4, 5 and 6 of the invention, and using a drive coil frequency of 2025 Hz. The test sample was chosen to be analogous in size and magnetic nanoparticle concentration to that of a magnetically impregnated sentinel lymph node. It comprised a cylindrical gelatine capsule of length 12 mm and diameter 4 mm packed with cotton wool, into which a solution of 5 nm diameter iron oxide nanoparticles, with a total mass of iron of 1.7 mg, was dispersed. This test sample was mounted with its cylindrical axis perpendicular to the cylindrical axis of the probe.

The data in FIG. 7 show the output signal measured in volts and normalised to the mass 70 of iron in the test sample as a function of the separation 71 between the test sample and the tip of the probe along the cylindrical axis of the probe. The data illustrate an advantageous feature 72 of the invention, namely that the output signal strength varies approximately linearly with separation up to a separation of approximately 12 mm. The linearity is advantageous because it means that the signal strength varies in a measurable and reliable manner which a user can learn to recognise easily, thereby facilitating the location of a lymph node in the above product example. Furthermore, the 12 mm extent of this linear feature is advantageous because it means that lymph nodes within 12 mm of the skin are detectable using the probe, which exceeds the figure of merit of 10 mm, i.e. the maximum distance from the skin that sentinel lymph nodes are found, when the probe tip is pressed into the skin.

The data in FIG. 8 show the output signal, obtained in accordance with the embodiment of FIGS. 4, 5 and 6 of the invention, measured in volts and normalised to the mass 80 of iron in the test sample as a function of the lateral displacement 81 of the probe (at a constant longitudinal displacement of 10 mm). More precisely, in a Cartesian coordinate system in which x is the cylindrical axis of the test sample, xy is the plane in which both the test sample and probe cylindrical axes lie, and the centre point of the test sample is at x=0 mm and y=0 mm, the probe was moved so that its tip travelled from x=−25 mm to x=+25 mm at constant y=10 mm. The cylindrical axis of the probe was kept parallel to the y axis throughout.

The data in FIG. 8 illustrate an advantageous feature 82 of the invention, namely that the output signal strength falls off rapidly beyond a lateral displacement of approximately +/−5 mm. This rapid fall off is advantageous because it means that the lateral resolution is sufficiently good that a user of the probe can reasonably be expected to detect and locate sentinel lymph nodes using the probe.

A Non-Destructive Evaluation Tool for Detecting Voids and Defects in Aluminium

An extremely important application of non-destructive evaluation is in the detection and monitoring of cracks, defects and voids in large metal structures. One of the standard methods applied is to pass a current through the object, or a part of the object, and monitor the change in point-to-point electrical resistance of the object, looking out for the characteristic increases in resistance associated with cracks, fractures or other defects. However, most such methods are limited to surveys of the surface or near-surface regions of the object.

The product example of the invention, in this case, would be a non-destructive evaluation tool that would operate without the need to pass any current through the object, and which would be operated while not in contact with the object. The tool could be tailor-made to suit any particular application: for example in oil pipelines comprising cylindrical steel sections of a given wall thickness, the sense-coil/driving-coil probe could be designed to deliver an external magnetic field sufficient to penetrate the entirety of the wall thickness. Alternatively it could be designed to selectively probe the near-surface region of the structure.

By way of illustration, an aspect of the above product example wherein it is possible to distinguish between magnetic signals due to the induced magnetisation of a magnetic material, and the magnetic responses due to induced current flow in an electrically conducting material is now described.

Figure 9:
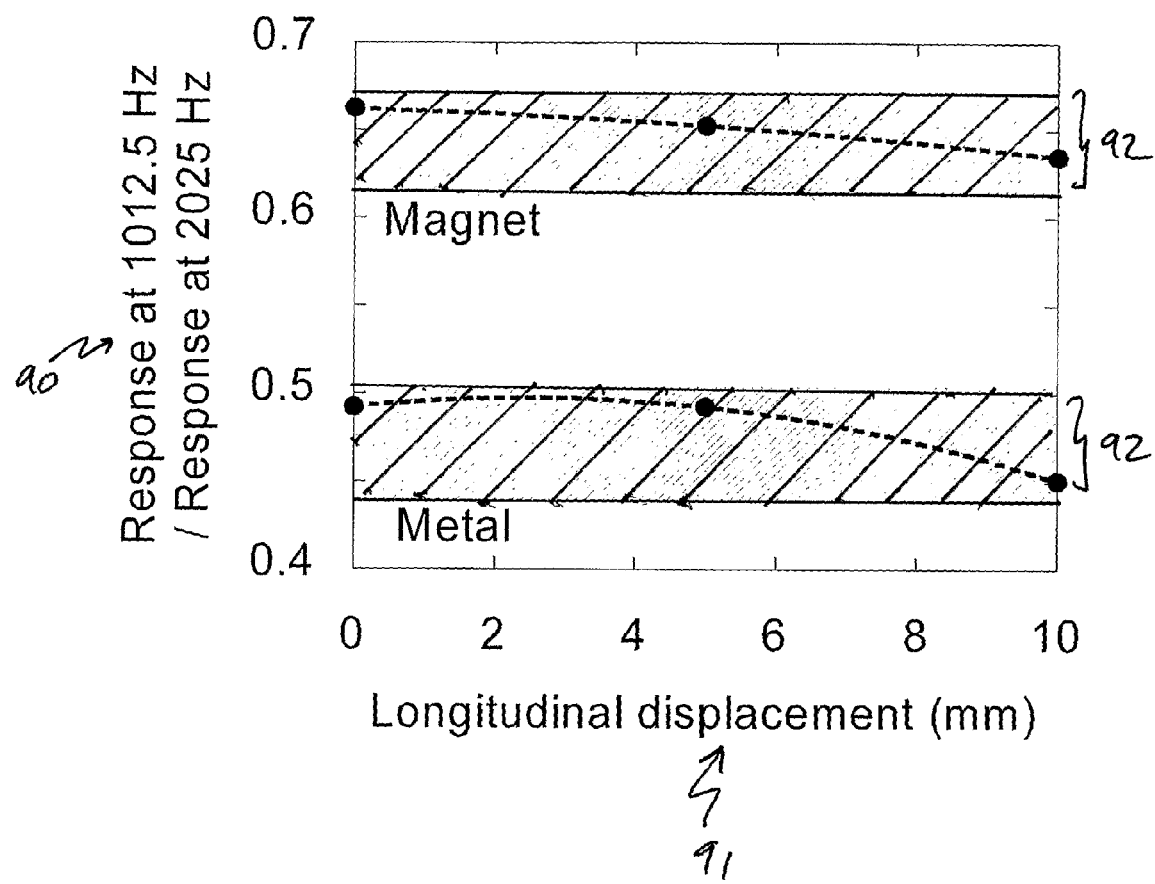
FIG. 9 is a graph of the ratio of the output signal of the present invention in accordance with the embodiment of FIG. 4 measured at drive frequencies of 1012.5 Hz and 2025 Hz, as a function of longitudinal displacement of the probe from two test samples, one comprising 1.7 mg of 5 nm diameter iron oxide nanoparticles, and another comprising a 4.0 mg mass, 10 mm by 10 mm area aluminium metal sheet.

FIG. 9 shows the ratio of the output signal of the present invention, according to the embodiment described with reference to FIGS. 4, 5 and 6, measured at drive frequencies 90 of 1012.5 Hz and 2025 Hz of two test samples as a function of longitudinal displacement 91 of the probe from the sample. Two test samples were used: one comprising 1.7 mg of 5 nm diameter iron oxide nanoparticles (denoted 'magnet' in FIG. 9) and another comprising a 4.0 mg mass, 10 mm by 10 mm area aluminium metal sheet (denoted 'metal' in FIG. 9).

The data in FIG. 9 illustrate an advantageous feature 92 of the invention, namely that for separations between sample and probe tip of up to approximately 10 mm, the magnetic response due to a magnet and a metal sample can be distinguished by comparing the ratio of the signals measured at two different frequencies. This distinguishing feature is advantageous because it means that changes in the drive frequency between two or more frequencies can be used to distinguish between magnetic responses due to both magnetic and metallic sources.

Furthermore, it will be noted that the data in FIG. 9 refer to the ratios in the amplitudes of the measured magnetic signals, and that invention of the embodiment described in conjunction with FIGS. 4, 5 and 6 also measures the phase shift of the magnetic signals relative to the drive signal. At a drive frequency of 2025 Hz the phase was −8° for the magnetic sample and +81° for the metallic sample. At a drive frequency of 1025.5 Hz the phase was −44° for the magnetic sample and +46° for the metallic sample. Thus, the difference in phase shift between the magnetic signals from the magnetic and metallic test samples remains approximately 90°, irrespective of the drive frequency. This constancy of the phase difference is advantageous, as it provides a rationale for resolving signals arising from a combination of magnetic and metallic sources.

A further example of a suitable application of the present invention would be in the aeronautics industry, where large metallic objects such as aeroplane wings are typically made of strengthened aluminium. In such a case it is very important to be able to detect flaws and weaknesses due to defects such as voids. The invention is ideally suited to this problem in that it can be operated as a high sensitivity susceptometer, capable of detecting the change in magnetic susceptibility between the aluminium matrix and the air-filled void.

It will of course be understood that the present invention has been described above purely by way of example and modifications of detail can be made within the scope of the invention.

The invention claimed is:

1. An apparatus for determining magnetic properties of materials, comprising:
    a remote superconducting quantum interference device (SQUID) located within a cryostat;
    means for applying an alternating magnetic field to a sensing region containing a material;
    means for sensing a change in a magnetic parameter of the material resulting from the applied alternating magnetic field and for generating a sensor output signal in response thereto;
    means for conveying the sensor output signal to the remote SQUID which is located remotely from the means for sensing a change in a magnetic parameter of the material; and
    means for receiving an output signal from the remote SQUID indicative of a sensed magnetization,
    wherein the means for sensing a change in a magnetic parameter of the material is not located within the cryostat, and
    wherein the sensing means comprises a sensor coil and the sensor coil comprises a central region containing substantially one half of the total number of turns of the coil and two side regions each containing substantially one quarter of the number of turns of the coil and wound in opposition to the turns of the central region.

2. A probe for detecting magnetic properties of materials, comprising:
    a rod having a longitudinal axis and an exterior surface about the longitudinal axis;
    a sensor coil wound circumferentially on the rod about its longitudinal axis;
    a former assembly disposed on the rod circumferentially about the longitudinal axis of the rod; and
    a drive coil wound circumferentially on the former assembly about the longitudinal axis of the rod,
    wherein the drive coil is spaced by the former assembly a distance from the exterior surface of the rod,
    wherein the sensor coil comprises a first set of windings consisting of a pair of windings arranged on the rod symmetrically each side of the former assembly.

3. The probe as claimed in claim 2, wherein the former assembly comprises:
    a winding surface for supporting the drive coil having an axis perpendicular to a plane in which the drive coil is supported, wherein the axis of the winding surface and the longitudinal axis of the rod are co-axial.

4. The probe as claimed in claim 2, wherein the sensor coil comprises a second set of windings constituting a central region containing substantially one half of the total number of turns of the coil and the first set of windings comprises two side regions each containing substantially one quarter of the number of turns of the coil and wound in opposition to the turns of the central region.

5. The probe as claimed in claim 2, wherein the sensor coil is in the form of a second-order gradiometer.

6. The probe as claimed in claim 2, wherein the sensor coil further comprises a second set of windings, wherein the first set of windings is arranged symmetrically on the rod each side of a second set of windings, wherein the second set of windings is arranged symmetrically each side of the former assembly.

7. The probe as claimed in claim 6, wherein the second set of windings comprises a second plurality of windings disposed each side of the former assembly and the first set of windings comprises a first plurality of windings disposed each side of the second set of windings and the second set of windings comprises fewer windings than the first set of windings.

8. The probe as claimed in claim 6, wherein the first set of windings is in the form of a first order gradiometer and the second set of windings is in the form of a first order gradiometer.

9. The probe as claimed in claim 6, wherein the first set of windings is connected to the second set of windings in such a way that an output signal of the sensor coil comprises a signal generated by the second set of windings subtracted from a signal generated by the first set of windings.

10. The probe as claimed in claim 9, wherein the ratio of the number of turns in the second set of windings to the number of turns in the first set of windings is such that the change in coupling between the drive coil and the sensor coil due to axial displacement of the drive coil with respect to the sensor coil is minimized.

* * * * *